United States Patent
Chow et al.

(10) Patent No.: US 9,520,354 B1
(45) Date of Patent: Dec. 13, 2016

(54) SILICON DESIGNS FOR HIGH VOLTAGE ISOLATION

(71) Applicant: Avago Technologies General IP (Singapore) Pte. Ltd, Singapore (SG)

(72) Inventors: Ricky Chow, Singapore (SG); Dominique Ho, Singapore (SG); Qian Tao, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/813,110

(22) Filed: Jul. 29, 2015

(51) Int. Cl.
*H01L 23/38* (2006.01)
*H01L 23/522* (2006.01)
*H01L 49/02* (2006.01)

(52) U.S. Cl.
CPC ......... *H01L 23/5222* (2013.01); *H01L 28/40* (2013.01)

(58) Field of Classification Search
CPC .......... H01L 49/02; H01L 23/38; H01L 29/06; H01L 23/481; H01L 29/0623; H01L 29/0642; H01L 29/66181
See application file for complete search history.

(56) References Cited

U.S. PATENT DOCUMENTS

| | | | |
|---|---|---|---|
| 6,088,214 A * | 7/2000 | Malone | H01G 5/16 361/278 |
| 7,732,889 B2 | 6/2010 | Crawley et al. | |
| 8,643,138 B2 | 2/2014 | Dong | |
| 9,007,141 B2 | 4/2015 | Steeneken | |
| 2014/0253227 A1 | 9/2014 | Yach et al. | |
| 2015/0115407 A1* | 4/2015 | Tao | H01L 23/481 257/532 |

* cited by examiner

*Primary Examiner* — Phuc Dang (57) ABSTRACT

An isolation system, isolation capacitor, and Integrated Circuit are disclosed. The isolation capacitor is described to include a first capacitive element, a second capacitive element, a primary isolation layer positioned between the first and second capacitive elements, as well as a secondary isolation layer positioned between the first and second capacitive elements. The secondary isolation layer has an area that is larger than an area of one or both of the first and second capacitive elements, thereby reducing the likelihood of breakdown between the first and second capacitive elements.

20 Claims, 11 Drawing Sheets

SILICON DESIGNS FOR HIGH VOLTAGE ISOLATION

FIELD OF THE DISCLOSURE

The present disclosure is generally directed toward electronic isolation and devices for accommodating the same.

BACKGROUND

There are many types of electrical systems that benefit from electrical isolation. Galvanic isolation is a principle of isolating functional sections of electrical systems to prevent current flow, meaning that no direct electrical conduction path is permitted between different functional sections. As one example, certain types of electronic equipment require that high-voltage components (e.g., 1 kV or greater) interface with low-voltage components (e.g., 10V or lower). Examples of such equipment include medical devices and industrial machines that utilize high-voltage in some parts of the system, but have low-voltage control electronics elsewhere within the system. The interface of the high-voltage and low-voltage sides of the system relies upon the transfer of data via some mechanism other than electrical current.

Other types of electrical systems such as signal and power transmission lines can be subjected to voltage surges by lightning, electrostatic discharge, radio frequency transmissions, switching pulses (spikes), and perturbations in power supply. These types of systems can also benefit from electrical isolation.

Electrical isolation can be achieved with a number of different types of devices. Some examples of isolation products include galvanic isolators, opto-couplers, inductive, and capacitive isolators. Previous generations of electronic isolators used two chips in a horizontal configuration with wire bonds between the chips. These wire bonds provide a coupling point for large excursions in the difference between the grounds of the systems being isolated. These excursions can be on the order of 25,000 V/usec.

As mentioned above, electrical isolation can be achieved with capacitive, inductive isolators, and/or RF isolators to transmit data across an isolation boundary. There have been some difficulties with developing and deploying capacitive isolators. For example, one issue that exists for capacitive isolators is that the dielectric material between the capacitive plates can be prone to electrical shorts/current leaks if the dielectric material is not of sufficient thickness. While this problem can be addressed by increasing the overall thickness of the dielectric material, increased dielectric thickness unfortunately results in reduced signal strength between the capacitive plates.

Another issue encountered by prior art capacitive isolators is that during fabrication of the top metal pattern, there could be metal remnants left behind after the etching process. These metal remnants can result in the creation of leakage paths between electrodes that are otherwise intended to be electrically isolated from one another. Thus current leakage could result in functional failure of the capacitive isolator.

Still another issue encountered by prior art capacitive isolators is that encapsulation stresses created due to conformal passivation may cause stress concentrations at the corners of metal edges on the substrate of the isolator. These stress concentrations can cause physical failure (e.g., decoupling) of the metal-to-substrate connection.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-7B, various configurations of isolation systems, isolators, isolation devices, and intermediate isolator configurations are depicted and described. Although some of the isolation systems depicted in the figures correspond to isolation systems of components thereof at intermediate stages of manufacturing (or in disassembled states), one of ordinary skill in the art will appreciate that any of the intermediate products herein can be considered an isolator or isolation system without departing from the scope of the present disclosure. In some embodiments, the isolators described herein may be incorporated into any system which requires current and/or voltage monitoring, but is susceptible to transients. In some embodiments, the isolation system in which an isolator described herein is rated to operate at about 5 kV, 10 kV, or more. Stated another way, the input side (e.g., a high-voltage side) of the isolator or isolation system may be directly connected to a 5 kV, 10 kV, 15 kV or greater source without damaging the isolator or any electronic devices attached to the output side (e.g., a low-voltage side) of the isolator. Accordingly, an isolation system which employs one or more of the isolators disclosed herein may be configured to operate in high-voltage or high-current systems but may also be configured to separate the high-voltage or high-current systems from a low-voltage or low-current system.

Figure 1:
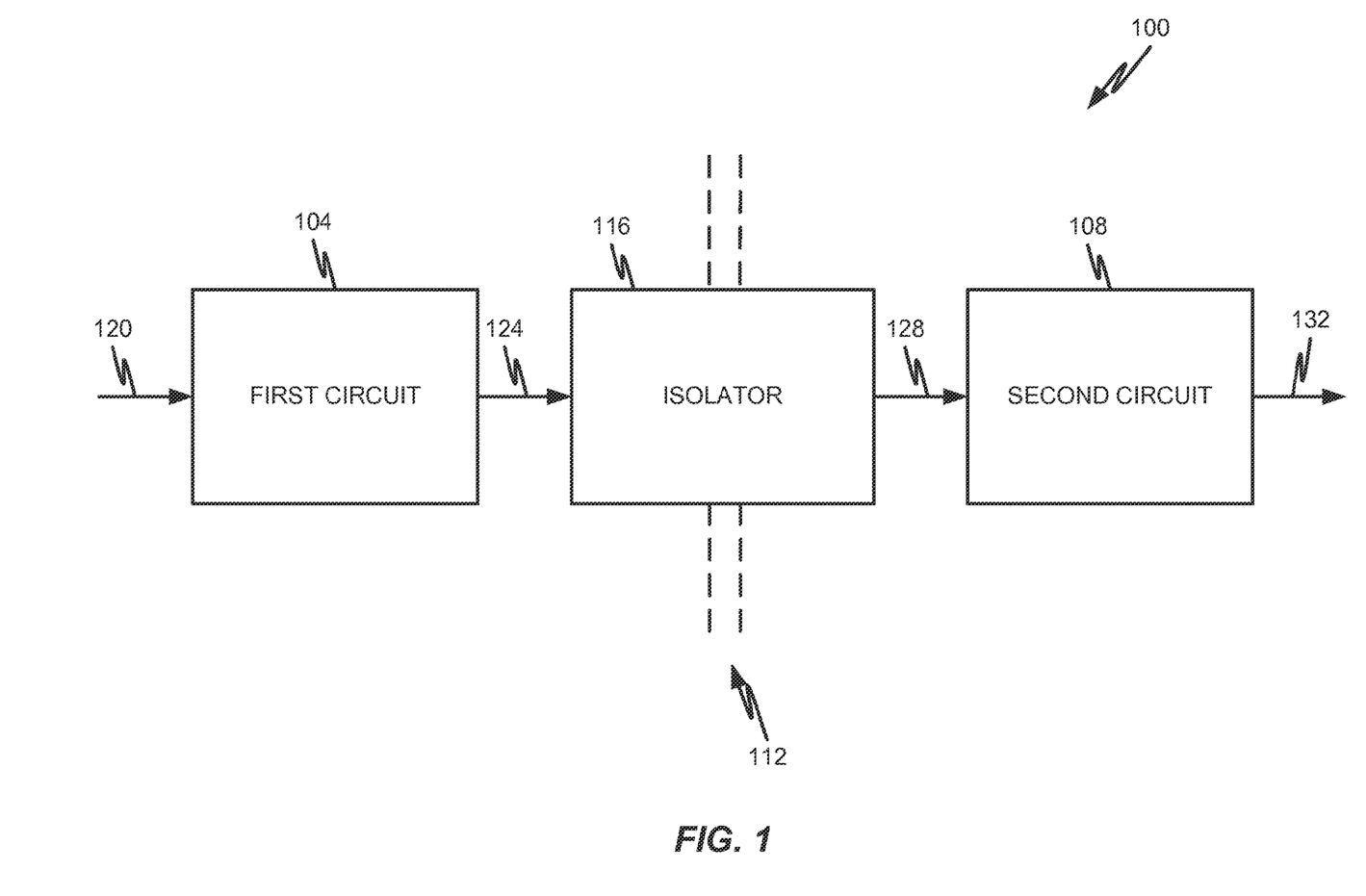
FIG. 1 is a schematic block diagram depicting an isolation system in accordance with embodiments of the present disclosure.

Referring now to FIG. 1, a first capacitive isolation system 100 will be described in accordance with at least some embodiments of the present disclosure. The system 100 is shown to include a first circuit 104 and second circuit 108 separated by an isolation boundary 112. In some embodiments, an isolator 116 may provide a mechanism for carrying communication signals across the isolation boundary 112.

The first circuit 104 may be operating in a high-voltage environment (e.g., with a ground potential at or exceeding 1 kV) whereas the second circuit 108 may be operating in a low-voltage environment (e.g., with a ground potential below 100V). Of course, the opposite condition may also be true without departing from the scope of the present disclosure. The isolation boundary 112 may provide the mechanism for protecting the low-voltage environment from the high-voltage environment. The isolator 116 may be configured to establish and maintain the isolation boundary 112 while simultaneously facilitating the exchange of communications from the first circuit 104 to the second circuit 108 and vice versa. It should be appreciated, however, that the second circuit 108 may be operating in the high-voltage environment and the first circuit 104 may be operating in the low-voltage environment.

For ease of discussion, the first circuit 104 will be explained as an input circuit whose current and/or voltage is being measured and by the second circuit 108 (e.g., an output circuit). The isolation boundary 112 is provided to electrically insulate the currents/voltages at the input circuit from the output circuit.

In some embodiments, the first circuit 104 receives a first input signal 120 at a first voltage (e.g., a high voltage). The first circuit 104 outputs a first output signal 124 to the isolator 116. The first output signal 124 is still at the same nominal voltage as the first input signal 120. The isolator 116 communicates information from the first output signal 124 to the second circuit 108 via a second input signal 128. The second input signal 128 is now as a second voltage (e.g., a low voltage) by operation of the isolator 116. The second circuit 108 then processes the second input signal 128 and generates a second output signal 132 that is communicated to additional circuitry or controller components. Even though the first circuit 104 operates at a different voltage than the second circuit 108 and there is an electrical isolation between the two circuits 104, 108, the isolator 116 is able to preserve the information from the first output signal 124 and communicate that information to the second circuit 108 via the second input signal 128. The second input signal 128 may correspond to a logical representation or copy of the first output signal 124. The second input signal 128 is essentially a reproduction of the first output signal 124 on different circuitry and at a different potential.

Figure 2:
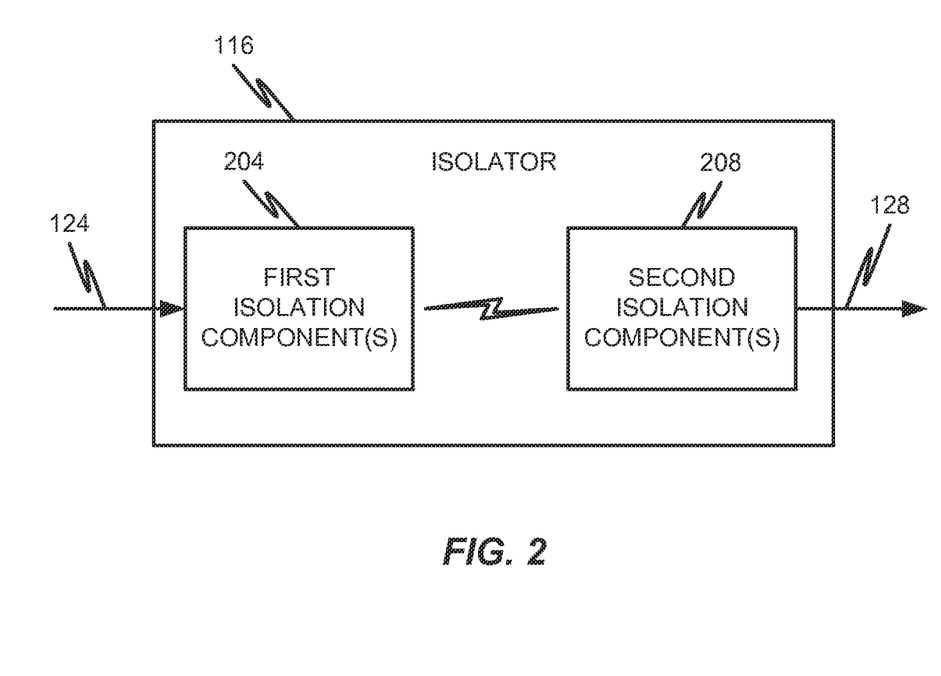
FIG. 2 is a schematic block diagram depicting details of a capacitive isolator in accordance with embodiments of the present disclosure.

With reference now to FIG. 2, additional details of the isolator 116 will be described in accordance with at least some embodiments of the present disclosure. The isolator 116, as discussed above, is responsible for communicating information between the first circuit 104 and second circuit 108 while simultaneously maintaining the isolation boundary 112 between the circuits 104, 108. Communication of the signal 124 across the isolation boundary 112 is achieved by one or more isolation components 204, 208, which may correspond to capacitive isolation components as will be discussed in further detail herein.

The isolator 116 may comprise first isolation component(s) 204 on its input side and second isolation component(s) 208 on its output side. The first isolation component(s) 204 and second isolation component(s) 208 may correspond to capacitive plates or the like that work together to communicate signals between one another wirelessly, thereby maintaining the isolation boundary 112. In some embodiments, the isolation components 204, 208 communicate with one another via capacitive coupling. Other coupling techniques such as inductive coupling, magnetic coupling, or the like may also be used by isolator 116.

Figure 3:
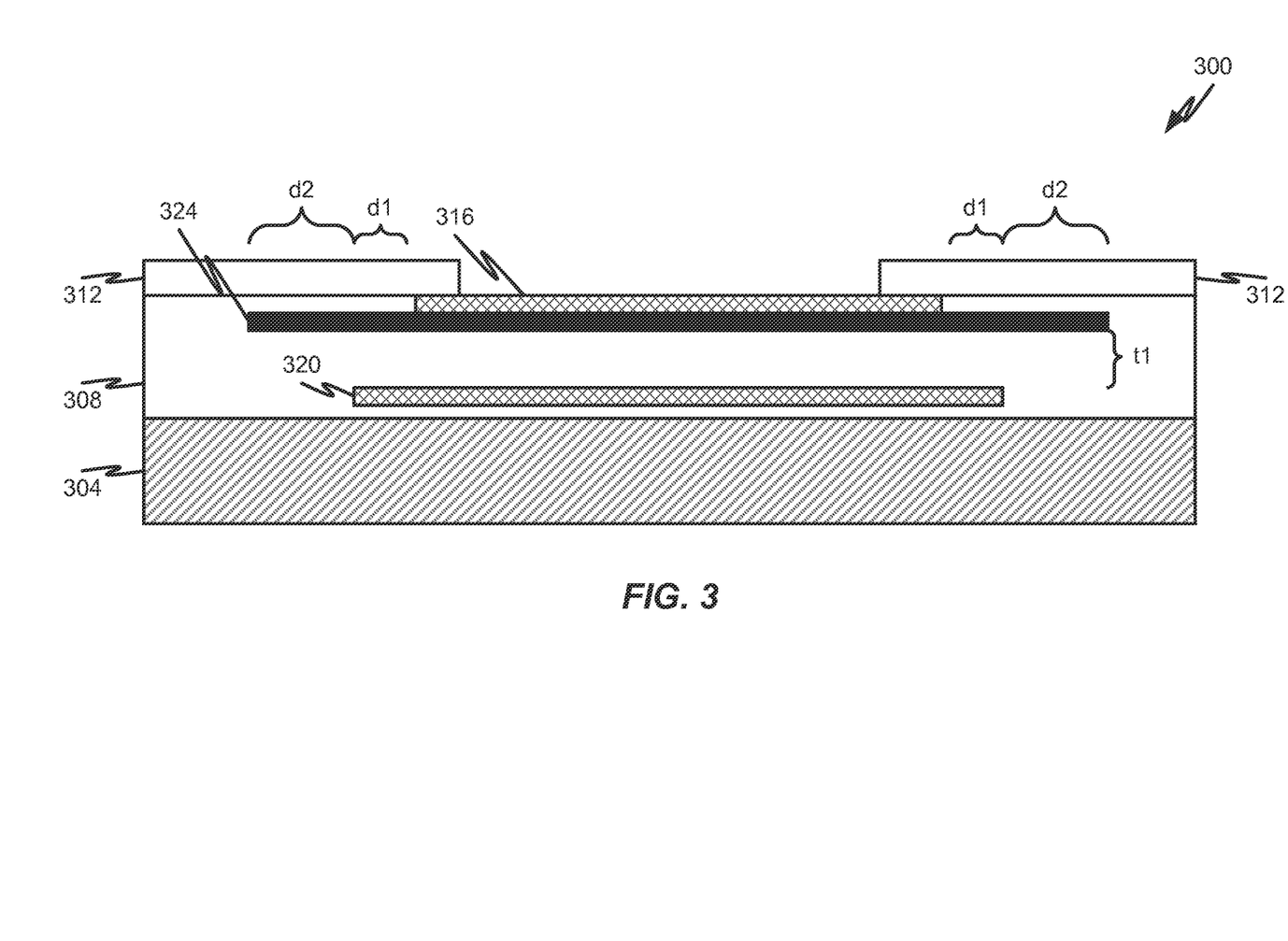
FIG. 3 is a cross-sectional view of a capacitive isolator construction in accordance with embodiments of the present disclosure.

With reference now to FIG. 3, additional details of a capacitive isolator 300 will be described in accordance with at least some embodiments of the present disclosure. The capacitive isolator 300 may correspond to one example of a device that can operate as isolator 116. The capacitive isolator 300 is depicted as having a substrate 304 supporting one or more dielectric layers 308, 312. The capacitive isolator 300 may further include a top capacitive plate 316 and a bottom capacitive plate 320. The depicted capacitive isolator 300 is shown to have both the top capacitive plate 316 and bottom capacitive plate 320 established in a common dielectric layer (e.g., the first dielectric layer 308). It should be appreciated, however, that one of the capacitive plates may be established on or in one dielectric layer while the other capacitive plate may be established on or in a different dielectric layer, thereby causing more than one dielectric layer to reside between the capacitive plates. However, for purposes of illustration and simplicity, the capacitive isolator 300 is shown to have both the top capacitive plate 316 and the bottom capacitive plate 320 established on or in the same dielectric layer 308. The top capacitive plate 316 may correspond to an example of the first isolation component 204 whereas the bottom capacitive plate 320 may correspond to an example of the second isolation component 208. This relationship can, of course, be reversed without departing from the scope of the present disclosure.

In prior art isolators, the single dielectric layer 308 would be the only material that electrically separates the top capacitive plate 316 from the bottom capacitive plate 320. Thus, the electrical isolation boundary 112 was completely dependent upon the single dielectric layer 308 preventing current from leaking/arcing between the capacitive plates 316, 320. One way to improve the dielectric strength (and therefore improve the integrity of the isolation boundary 112) would be to simply increase the thickness of the dielectric layer 308. However, increasing the thickness of the dielectric layer 308 would significantly reduce the signal strength between the capacitive plates 316, 320, thereby causing the isolator 300 to potentially lose signals between the circuits. In other words, the signal strength between the capacitive plates 316, 320 would reduce as the capacitance reduces between the two plates 316, 320.

Thus, embodiments of the present disclosure propose the addition of a secondary isolation layer 324 between the capacitive plates 316, 320. With the addition of a secondary isolation layer 324, the isolation barrier 112 is strengthened between the capacitive plates 316, 320 without compromising the capacitance (and signal strength) of the capacitor formed by the capacitive plates 316, 320 as compared to the situation where a mono-structure of the main isolation layer 308 were simply made thicker. Thus, the utilization of a primary isolation layer via the first dielectric layer 308 as well as a secondary isolation layer 324 will help the capacitive isolator 300 maintain the isolation boundary 112 while also preserving communications between the circuits 104, 108.

In the depicted embodiment, the substrate 304 may correspond to one or multiple layers of material that are used to physically support the rest of the structure of the capacitive isolator 300. In particular, the substrate 304 may correspond to a solid substance or medium to which another substance (e.g., the first dielectric layer 308) is applied and adheres. In some embodiments, the substrate 304 may comprise silicon, metal oxide, and/or gallium arsenide (GaAs) that serves as the foundation for the construction of components in the capacitive isolator 300. The additional layers of materials applied to the substrate 304 may be applied using any type or combination of known manufacturing techniques such as deposition (e.g., Chemical Vapor Deposition (CVD) or Atomic Layer Deposition (ALD)), etching, masking, and/or fabrication.

The first dielectric layer 308 may correspond to a mono-structure (e.g., unitary crystalline structure) of any type of known dielectric material suitable for substantially preventing electrical current from flowing between the capacitive plates 316, 320. In some embodiments, the first dielectric layer 308 may comprise silicon dioxide (SiO2) or a functionally similar material. The second dielectric layer 312 may also comprise silicon dioxide, but may be deposited on the first dielectric layer 308 after the first and second capacitive plates 316, 320 and secondary isolation layer 324 have been deposited. Thus, there may be a noticeable boundary between the first dielectric layer 308 and second dielectric layer 312, even though the layers may be constructed of the same or similar materials.

The secondary isolation layer 324, in some embodiments, may correspond to an additional dielectric material deposited on or within the first dielectric layer 308. In some embodiments, the secondary isolation layer 324 may correspond to a dielectric film comprising silicon nitride or a similar material. In some embodiments, the utilization of a stronger and/or different dielectric material for the secondary isolation layer 324 as opposed to the main isolation layer (e.g., the first dielectric layer 308) can help to improve the isolation barrier 112 and minimize the possibility of current leakage between the capacitive plates 316, 320. The secondary isolation layer 324 may be provided on or in the first dielectric layer 308 using any type or combination of known manufacturing techniques (e.g., deposition, etching, masking, fabrication, etc.). In accordance with at least some embodiments, the thickness of the first dielectric layer 308 may be in the range of 5 to 20 um and the secondary isolation layer 324 may have a thickness in the range of 0.1 to 1 um. Thus, the thickness of the secondary isolation layer 324 may be substantially less (e.g., by orders of magnitude) than the thickness of the first dielectric layer 308 and the thickness of the secondary isolation layer 324 does not contribute to an increased thickness of the first dielectric layer 308.

The top and bottom capacitive plates 316, 320 may be constructed of any electrically conductive material, such as metal. The capacitive plates 316, 320, more specifically, may correspond to a simple metal plate (e.g., gold, silver, copper, tin, etc.) or a non-metal plate, such as a polysilicon layer. In other words, any of the capacitive plates described and claimed herein may correspond to a traditional metal area of material or a polysilicon layer of material. The top capacitive plate 316 may or may not be covered by a passivation layer (e.g., the second dielectric layer 312). The top capacitive plate 316 may comprise a wire bond or trace connected thereto that carries electrical current to/from the first circuit 108. The bottom capacitive plate 320 may comprise a trace or electrically-conductive via that electrically connects the bottom capacitive plate 320 to the second circuit 108. The first and/or second circuits 104, 108 may also be established on the common substrate 304 or they may be externally connected to the capacitive isolator 300 via a Printed Circuit Board (PCB) or the like through electrical leads and traces.

In accordance with at least some embodiments, the top capacitive plate 316 and bottom capacitive plate 320 may not have the same area. Instead, one of the capacitive plates may be smaller in area than the other capacitive plate. In the illustrated embodiment, the top capacitive plate 316 is depicted as having a smaller area (e.g., smaller width/diameter) than the bottom capacitive plate 320; however, it should be appreciated that the bottom capacitive plate 320 may have a smaller area than the top capacitive plate 316. The smaller capacitive plate of the two capacitive plates substantially dictates the capacitive area (e.g., the overlapping area) for the capacitor created by the capacitive plates 316, 320. The utilization of differently sized capacitive plates 316, 320 provides many benefits including manufacturing benefits. If differently sized capacitive plates 316, 320 are utilized, then it becomes less critical to perfectly align the center of one capacitive plate with the center of the other capacitive plate. Thus, the bottom capacitive plate 320 can be deposited with some amount of flexibility and then, at a later time during the manufacturing process, the top capacitive plate 320 can also be deposited with some amount of flexibility.

As seen in FIG. 3, the cross-sectional width of the top capacitive plate 316 may be somewhat smaller than the cross-sectional width of the bottom capacitive plate 320. Assuming for illustrative purposes that both plates 316, 320 are circular in area, then the diameter of the bottom capacitive plate 320 may be larger than the diameter of the top capacitive plate 316 by an amount of two (2) times d1, which is shown to be the difference between the outer edge of the top capacitive plate 316 and the outer edge of the bottom capacitive plate 320 (assuming the centers of the plates are substantially aligned).

It can also be seen in FIG. 3, that the area of the secondary isolation layer 324 is greater than that of both capacitive plates 316, 320. Assuming again circular geometries, the secondary isolation layer 324 comprises a diameter that is two (2) times d2, which is shown to be the difference between the outer edge of the secondary isolation layer 324 and the outer edge of the larger capacitive plate 320 (assuming the center of the secondary isolation layer 324 is substantially aligned with the centers of the plates). Extending the secondary isolation layer 324 beyond both the capacitive plates 316, 320 helps to increase the breakdown path that would have to be followed by current flowing between the capacitive plates. In other words, breakdown or leakage current would have to flow around the secondary isolation layer 324, which makes the possibility of current leakage between the plates 316, 320 much lower.

The secondary isolation layer 324 may be deposited on or within the first dielectric layer 308 in discrete amounts as shown in FIG. 3, or the secondary isolation layer 324 may be uniformly deposited across the entirety of the first dielectric layer 308 (e.g., as a thin film) and then portions of the thin film may be removed, thereby resulting in the creation of discrete deposits of the secondary isolation layer 324.

In accordance with at least some embodiments, the top capacitive plate 316 is deposited directly onto the top of the secondary isolation layer 324, which means that the two layers 316, 324 are in direct contact with one another and then the top surface of the top capacitive plate 316 is exposed on the top surface of the first dielectric layer 308. In some embodiments, the secondary isolation layer 324 may be deposited directly on top of the bottom capacitive plate 320, thereby causing the secondary isolation layer 324 to be in direct contact with the bottom capacitive plate 320. It should also be appreciated that the secondary isolation layer 324 may not be in direct contact with either of the plates 316 or 320 (e.g., it may float somewhere between the plates.

Although the secondary isolation layer 324 is shown as having a substantial thickness relative to the other components of the capacitive isolator 300, it should be appreciated that if the secondary isolation layer 324 is deposited as a thin film, then the actual thickness of the secondary isolation layer 324 is minimal or negligible as compared to the other components. For instance, the thickness t1 between the capacitive plates 316, 320 may be in the range of 5 to 20 um whereas the thickness of the dielectric layer 324 is less than 5% of that entire thickness t1. In some embodiments, the distance from the outer edge of the top capacitive plate 316 to the outer edge of the secondary isolation layer 324 (e.g., the sum of d1 and d2) may be greater than the distance between the capacitive plates 316, 320 (e.g., the thickness t1). Constructing the secondary isolation layer 324 in such a manner helps to significantly increase the length of the breakdown path without substantially increasing the capacitance between the plates 316, 320. This results in a better performing capacitive isolator 300 with respect to reducing current breakdowns while simultaneously maintaining signal strength.

Figure 4A:
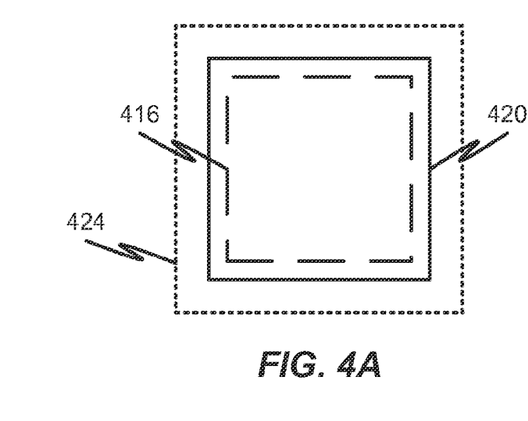
FIG. 4A depicts a first configuration of capacitive plates and dielectric film in accordance with embodiments of the present disclosure.
Figure 4B:
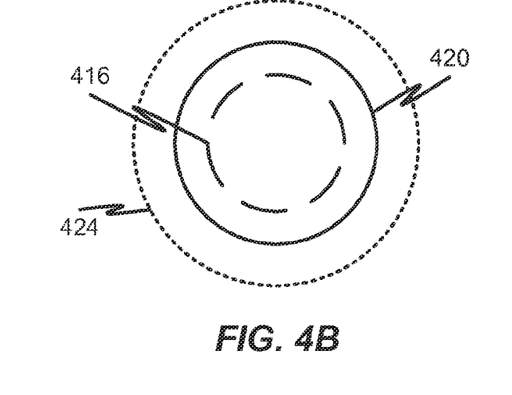
FIG. 4B depicts a second configuration of capacitive plates and dielectric film in accordance with embodiments of the present disclosure.
Figure 4C:
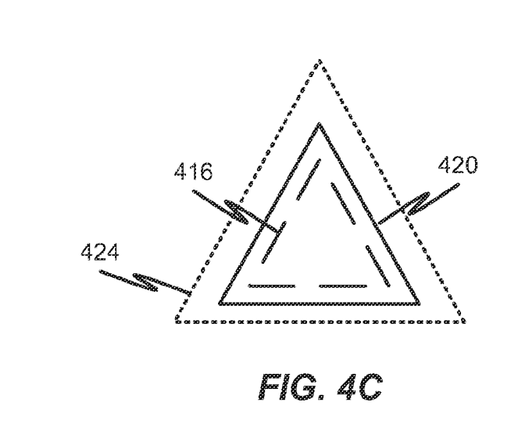
FIG. 4C depicts a third configuration of capacitive plates and dielectric film in accordance with embodiments of the present disclosure.
Figure 4D:
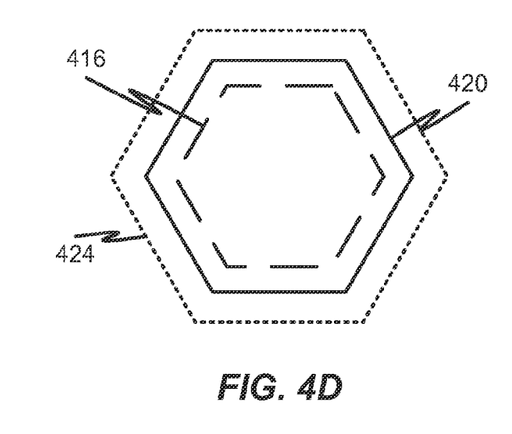
FIG. 4D depicts a fourth configuration of capacitive plates and dielectric film in accordance with embodiments of the present disclosure.

As can be seen in FIGS. 4A-D, the geometries (when viewed from above or below as opposed to being viewed in cross-section) of the capacitive plates 316, 320 and secondary isolation layers 324 can vary without departing from the scope of the present disclosure. With reference initially to FIG. 4A, the outer boundaries of the top capacitive plate 416 and bottom capacitive plate 420 are shown with respect to the outer boundary of the secondary isolation layer 424. The illustrative geometry depicted in FIG. 4A corresponds to a square or rectangular geometry. Another alternative would be to utilize circular geometries as shown in FIG. 4B. Examples of this particular geometry were also described in connection with FIG. 3 with respect to the dimensions d1 and d2. Although not depicted, oval/elliptical geometries may also be utilized for some or all of the elements 316, 320, 324. Another alternative would be to utilize triangular geometries as shown in FIG. 4C. Still another alternative would be to utilize hexagonal (or some other polygonal) geometries as shown in FIG. 4D. Combinations of geometries may also be utilized without departing from the scope of the present disclosure. For instance, one or both of the capacitive plates 316, 320 may have a circular geometry whereas the secondary isolation layer 324 may have a different and non-circular geometry (e.g., rectangular, polygonal, etc.).

With reference now to FIGS. 5A-D, additional details of a capacitive isolator 500 will be described in accordance with at least some embodiments of the present disclosure. The capacitive isolator 500 may correspond to another example of a device that can operate as isolator 116. The features of capacitive isolator 500 may alternatively or additionally be incorporated into any of the other capacitive isolators (e.g., capacitive isolator 300) depicted and described herein.

The capacitive isolator 500 is shown as a solution to other problems encountered during manufacture of capacitive isolators. In particular, during the top metal pattern etch of traditional capacitive isolators, there could be metal remains left after the etching process. These metal remains could create a lateral leakage/breakdown path between a metal via in the isolator 500 and one of the capacitive plates in the isolator 500. The creation of such a lateral leakage/breakdown path could result in functional failure of these traditional capacitive isolators. Accordingly, it is an aspect of the capacitive isolator 500 to avoid the potential of creating a lateral leakage/breakdown path.

Figure 5A:
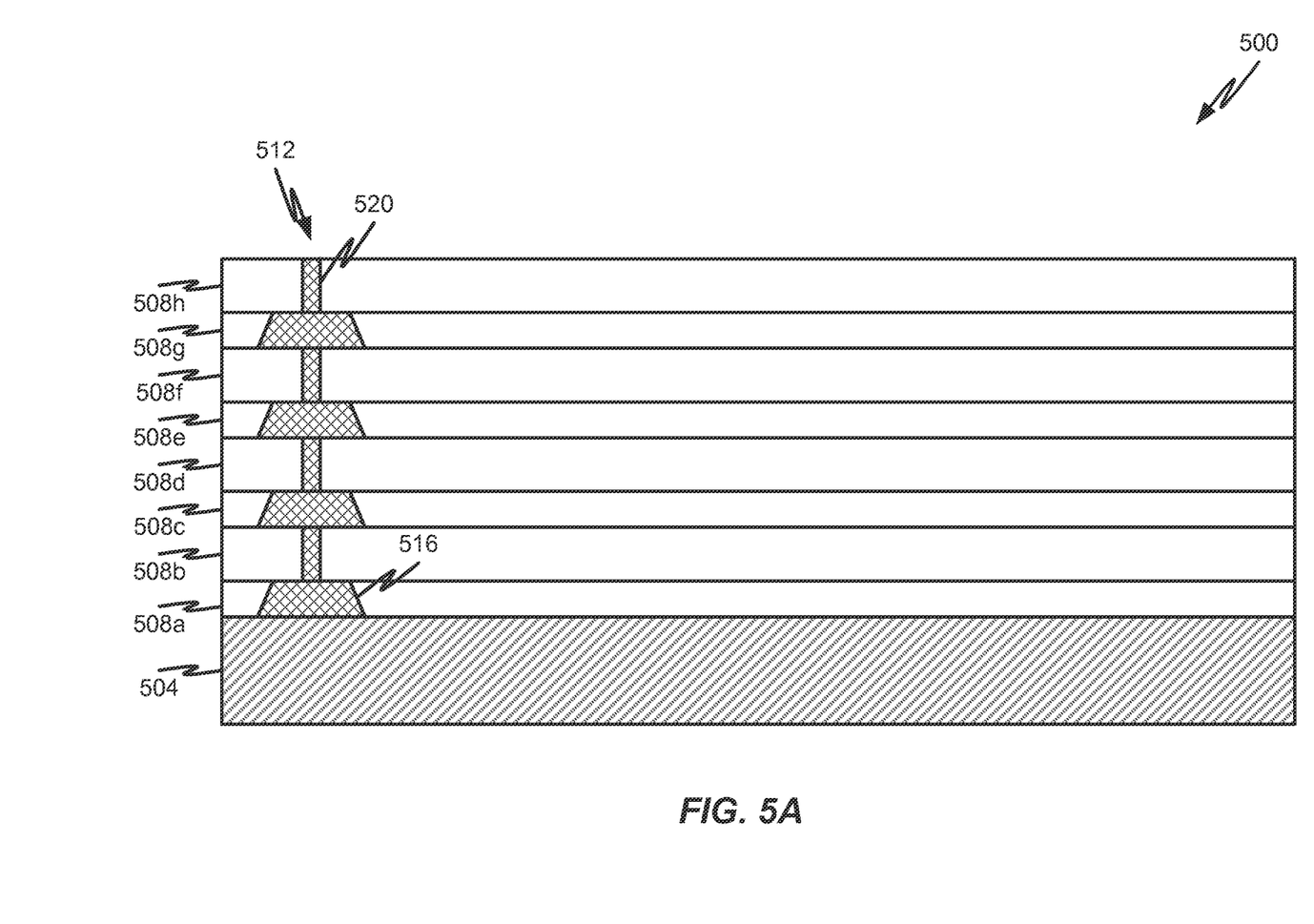
FIG. 5A depicts a cross-sectional view of a capacitive isolator in a first phase of production in accordance with embodiments of the present disclosure.

Referring initially to FIG. 5A, a first phase of production for the capacitive isolator 500 will be described in accordance with embodiments of the present disclosure. This first depicted phase corresponds to a phase prior to the top metal deposition on the capacitive isolator 500. The capacitive isolator 500 in this first phase of production is shown to include a substrate 504 along with a plurality of dielectric layers 508*a-h*. The plurality of dielectric layers 508*a-h* are deposited on top of substrate 504 and an electrically conductive via 512 is established through all of the plurality of dielectric layers 508*a-h* down to the substrate 504. As can be seen in FIG. 5A, some of the dielectric layers are thicker than others of the dielectric layers. In the depicted embodiment, the dielectric layers 508*a-h* are alternating thicker and thinner. In particular, the thinner of the dielectric layers corresponds to layers 508*a*, 508*c*, 508*e*, and 508*g*. The thicker of the dielectric layers corresponds to layers 508*b*, 508*d*, 508*f*, and 508*h*. It should be appreciated that the order of thin-thick-thin can be reversed such that the thicker layer is deposited directly on top of the substrate 504 and the thinner layer is provided at the top of the plurality of dielectric layers 508*a-h*. Moreover, the number of dielectric layers in the plurality of dielectric layers does not necessarily have to include the exact number of dielectric layers depicted in FIG. 5A. Instead, a greater or lesser number of dielectric layers may be utilized without departing from the scope of the present disclosure.

In the depicted embodiment, each of the thinner dielectric layers comprises an extended trapezoidal metal via 516 whereas the thicker dielectric layers comprise thinner post-like metal vias 520. The alternating extended vias 516 and thinner via 520 are stacked one upon another to collectively form the electrically conductive via 512 through the plurality of dielectric layers 508*a-h*. The trapezoidal nature of the extended vias 516 may be due, at least in part, to manufacturing techniques used for the thinner dielectric layers. The thinner vias 520 may correspond to solid metal materials deposited in the thicker dielectric layers or the thinner vias 520 may correspond to holes extending through the thicker dielectric layers with a conductive wall extending through the hole.

Figure 5B:
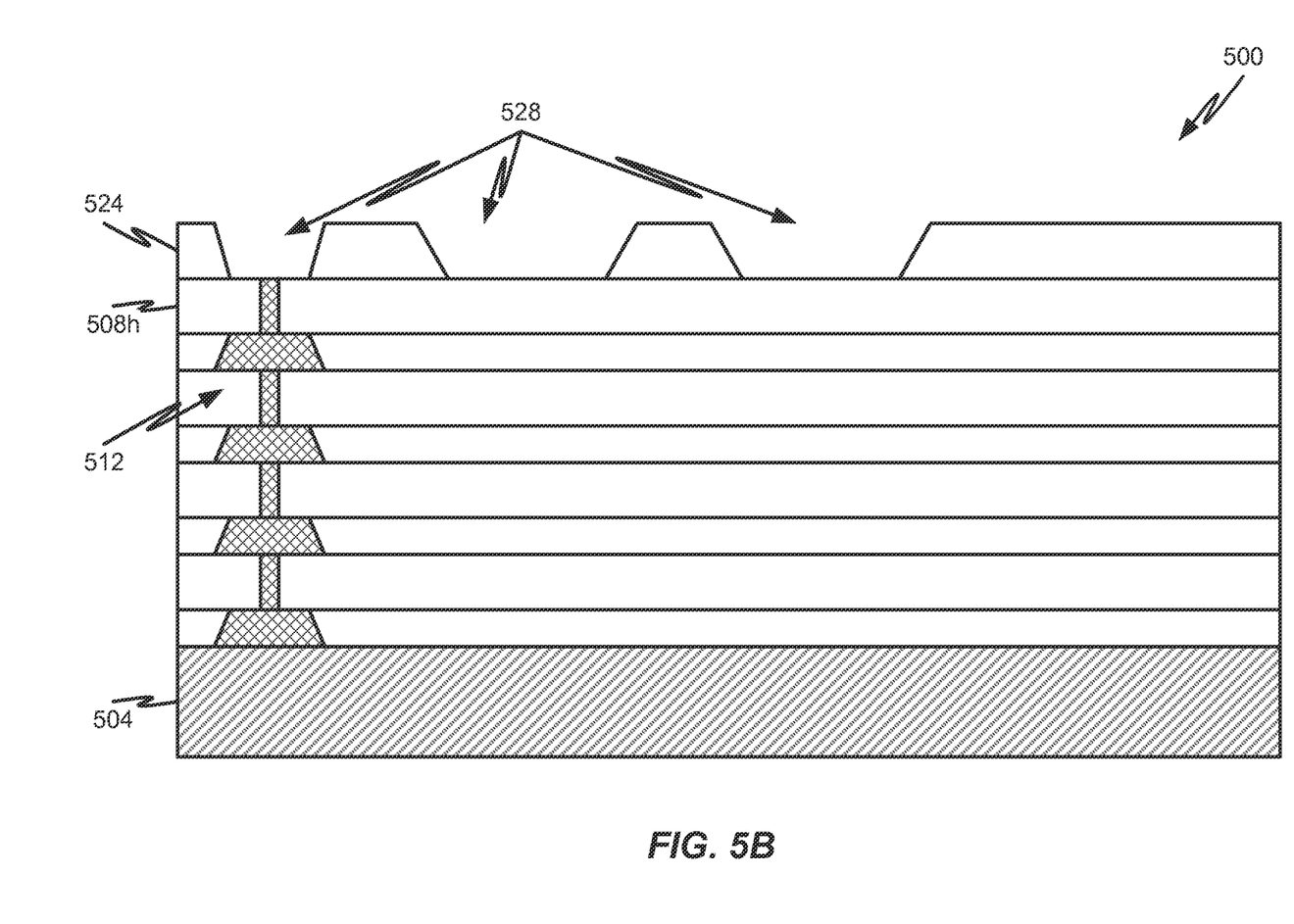
FIG. 5B depicts a cross-sectional view of the capacitive isolator in a second phase of production in accordance with embodiments of the present disclosure.

With reference now to FIG. 5B, a second phase of production of the capacitive isolator 500 will be described in accordance with at least some embodiments of the present disclosure. The second phase of production shows a deposition of a passivation layer 524 on the top dielectric layer 508*h* and then one or more voids 528 created in the passivation layer 524. In some embodiments, the passivation layer 524 may be deposited across the entirety of the top dielectric layer 508*h* and then the voids 528 may be created by etching the material of the passivation layer 524 away from selected areas. In other embodiments, the passivation layer 524 may be selectively deposited resulting in the immediate creation of the voids 528 in selected areas. At least one of the voids 528 is established over the electrically conductive via 512 whereas others of the voids 528 are established adjacent to the electrically conductive via 512. Those voids 528 not established over the electrically conductive via 512 may correspond to voids that will be used to create metal areas, which may be used for conductive plates, electrodes/electrical connection points, or other electrically conductive elements in the capacitive isolator 500.

Figure 5C:
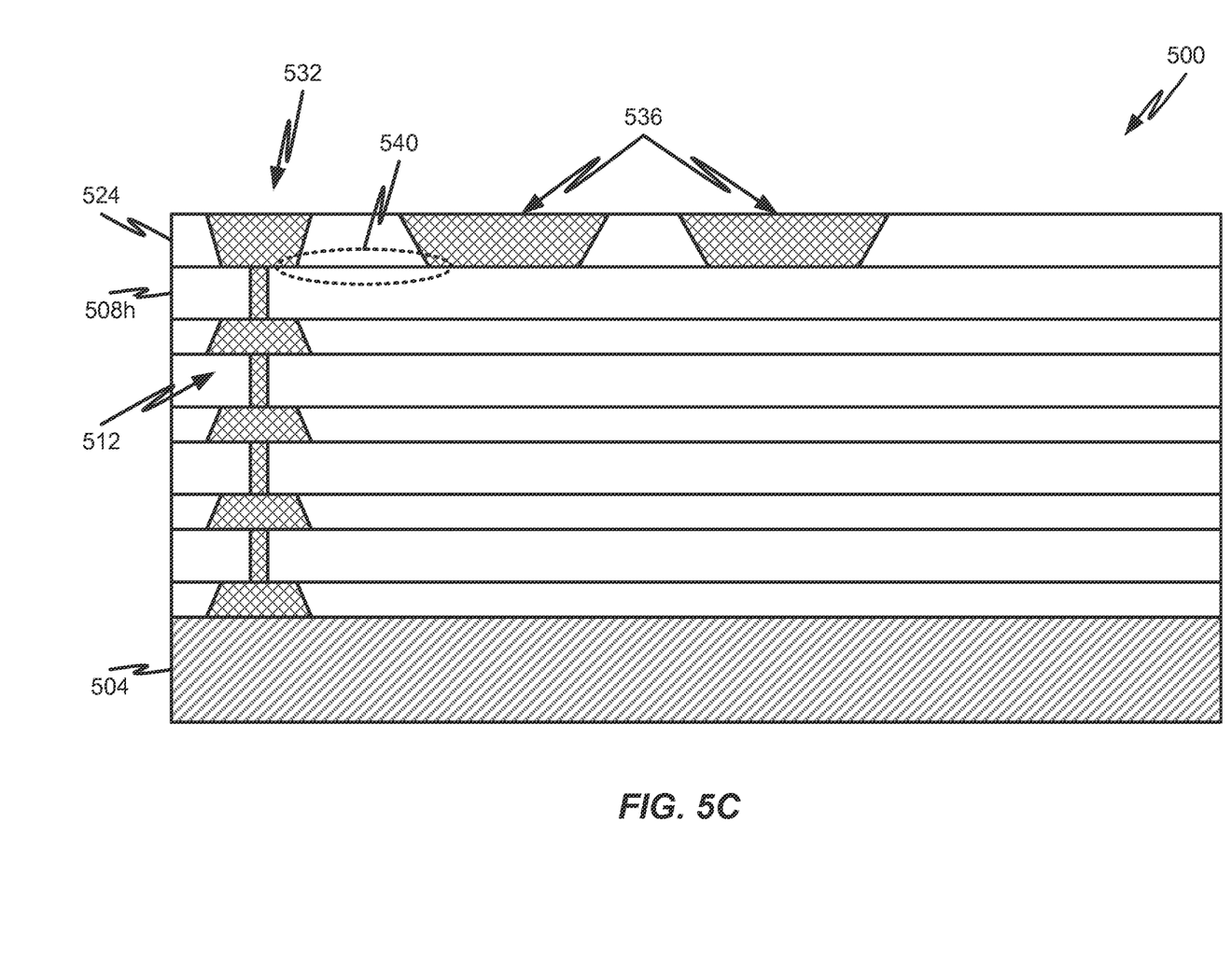
FIG. 5C depicts a cross-sectional view of the capacitive isolator in a third phase of production in accordance with embodiments of the present disclosure.

After the voids 528 have been established, the production process continues by filling the voids 528 with conductive material, thereby establishing conductive deposits 532, 536 in the passivation layer 524. In some embodiments, the conductive deposits 532, 536 may comprise a conductive metal (e.g., gold, copper, aluminum, tin, etc.) or a conductive non-metal material. As shown in FIG. 5C, the deposit 532 positioned over the electrically conductive via 512 may become a part of the electrically conductive via 512. Moreover, the deposit 532 may be inversely shaped with respect to the other extended vias 516 in the electrically conductive via 512. This inverse shaping may occur as a result of the etching process, which causes the opening of the void 528 at the top of the passivation layer 524 to be wider/larger than the closed end of the void 528. In some embodiments, the top end of the deposits 532, 536 may be wider/larger than the bottom end of the deposits 532, 536. The deposits 532, 536 may be provided in the voids 528 and then leveled using a Chemical Mechanical Polishing (CMP) process or the like. Once the tops of the deposits 532, 536 have been leveled to be substantially even with the top of the passivation layer 524, the risk of metal remaining at the top of the passivation layer 524 is extremely low. Moreover, the lateral interface 540 at the top surface of the top dielectric layer 508*h* and the bottom surface of the dielectric layer 524 is substantially devoid of electrically-conductive remains (e.g., metal remains) since no electrically-conductive material was ever deposited on the lateral interface 540. By avoiding the deposition of an electrically-conductive material at the lateral interface 540, the possibility of having current leakage and/or breakdown occur through the lateral interface 540 is substantially reduced.

Figure 5D:
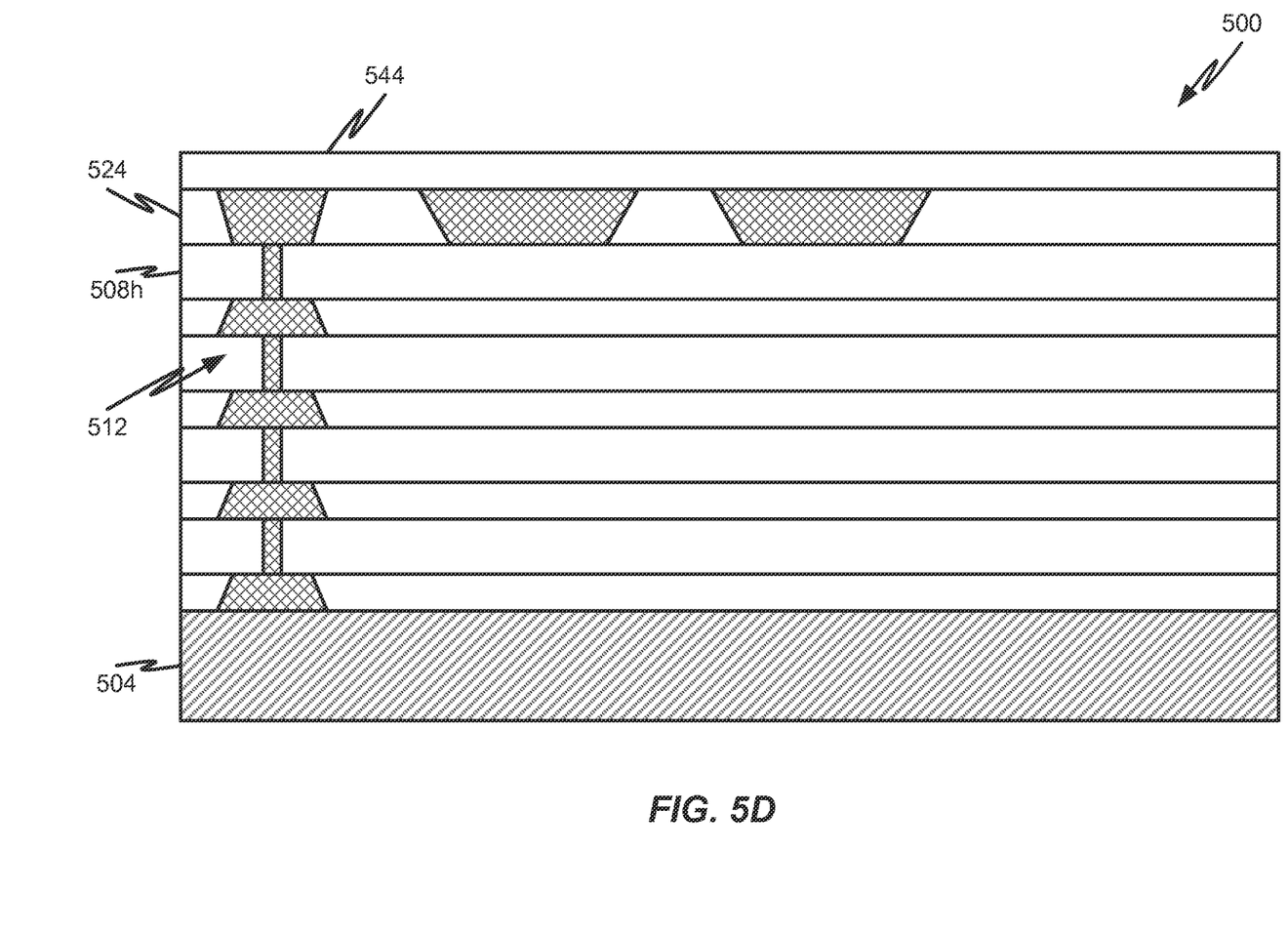
FIG. 5D depicts a cross-sectional view of the capacitive isolator in a fourth phase of production in accordance with embodiments of the present disclosure.

With reference now to FIG. 5D, a fourth phase of production of the capacitive isolator 500 will be described in accordance with at least some embodiments of the present disclosure. The fourth phase may or may not correspond to a final phase of production for the capacitive isolator 500. In this phase, a top passivation layer 544 is provided over the passivation layer 524 and deposits 532, 536. The top passivation layer 544 may comprise similar or identical materials to the passivation layer 524. In other embodiments, the passivation layers 524, 544 may have different materials. Non-limiting examples of materials that may be used in one or both of the passivation layers 524, 544 include silicon dioxide, silicon nitride, polyimide, and benzocyclobutene. As discussed above, the various metal deposits 532, 536 may be used as capacitive plates, electrical interconnects, and/or metal traces in the capacitive isolator 500.

Figure 6:
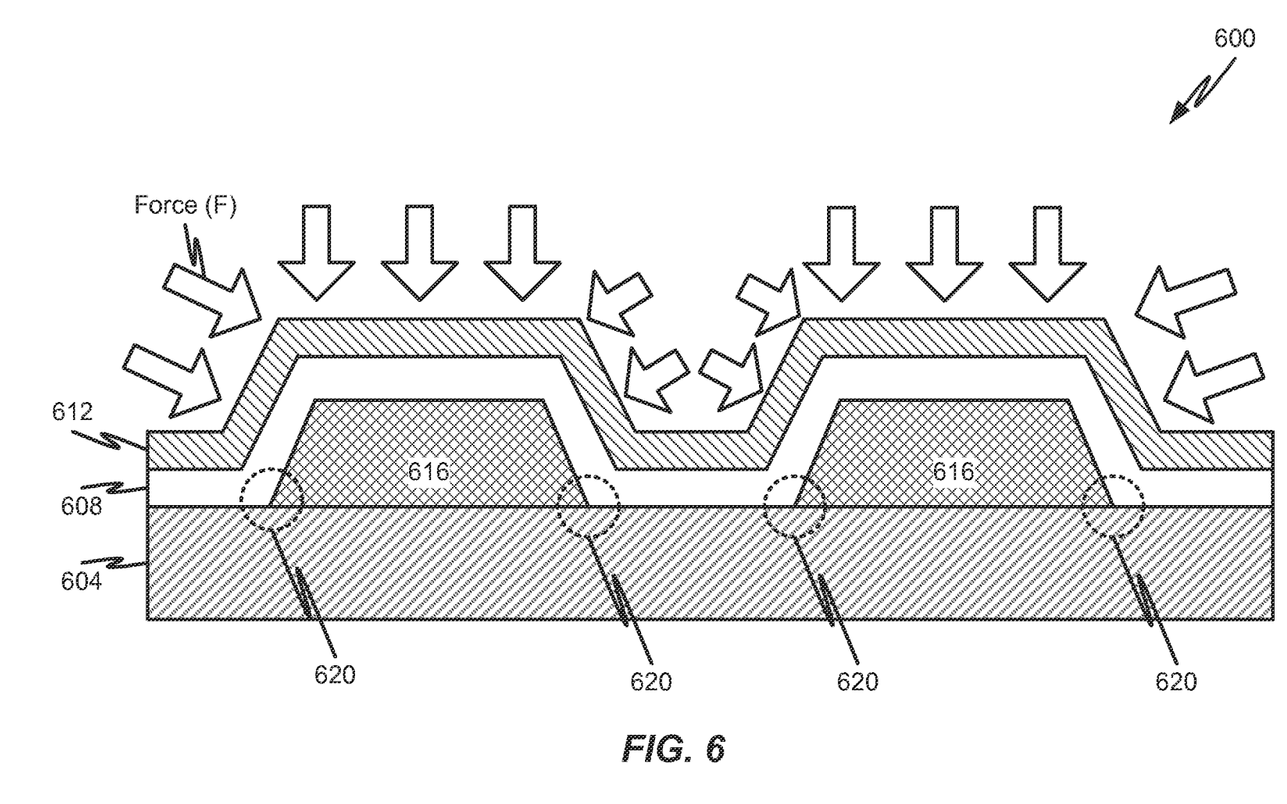
FIG. 6 depicts a cross-sectional view of a capacitive isolator using conformal passivation and the stresses induced thereby.

With reference now to FIG. 6, a capacitive isolator 600 using conformal passivation and the stresses induced thereby will be described in accordance with at least some embodiments of the present disclosure. The capacitive isolator 600 may correspond to yet another example of a device that can operate as isolator 116. The features of capacitive isolator 600 may alternatively or additionally be incorporated into any of the other capacitive isolators (e.g., capacitive isolator 300 and/or 500) depicted and described herein.

The depicted capacitive isolator 600 includes a substrate 604 with one or more metal deposits 616 provided thereon. The substrate 604 may be similar or identical to other substrates depicted and described herein. Likewise, the metal deposits 616 may be an example of capacitive plates and/or metal deposits 532, 536 depicted and described herein. It should be appreciated that the metal deposits may alternatively, or additionally, be provided on a dielectric layer that is positioned between the substrate 604 and the metal deposits 616. The capacitive isolator 600 also shows a first passivation layer 608 as well as a dielectric layer 612 above the first passivation layer 608. Both layers 608, 612 cover the substrate 604 and metal deposits 616. In some embodiments, the passivation layer 608 and dielectric layer 612 may include one or more of silicon dioxide, silicon nitride, polyimide, and benzocyclobutene. The layers 608, 612 may be deposited on the substrate 604 and metal deposits 616 using any type of known deposition technique (e.g., CVD, ALD, or the like).

The utilization of this conformal passivation may result in the development of encapsulation stresses at the corners 620 of the metal deposits 616. In particular, forces F exerted on the top passivation layer 612 may be directed both downwardly as well as laterally at the conformal edges of the deposition. The development of these encapsulation stresses may result in premature failure (e.g., delaminating or cracking) of the capacitive isolator 600 between the bottom passivation layer 608 and substrate 604 and/or between the metal deposits 616 and substrate 604.

Figure 7A:
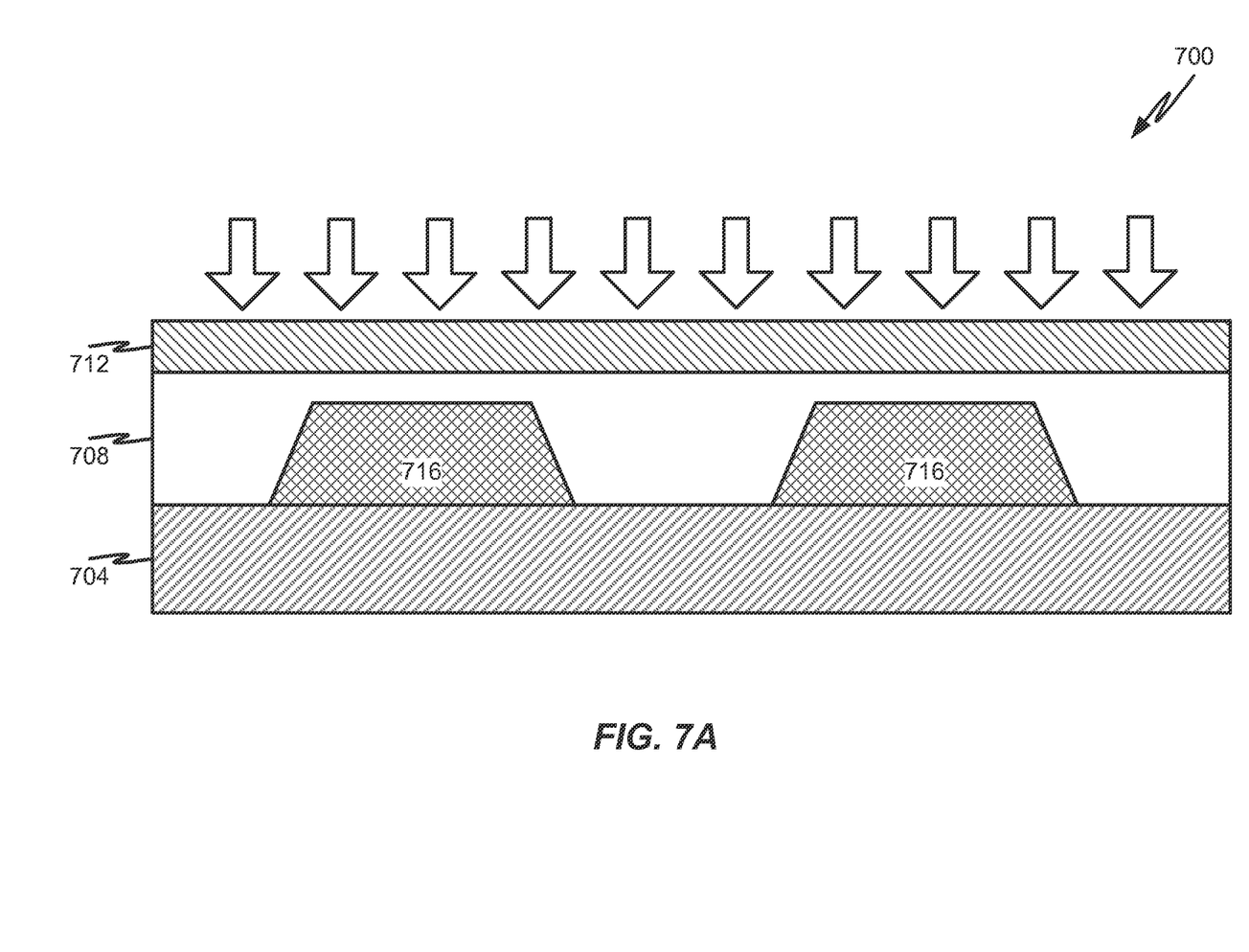
FIG. 7A depicts a cross-sectional view of a capacitive isolator using gap-filling passivation in a first phase of production in accordance with embodiments of the present disclosure.
Figure 7B:
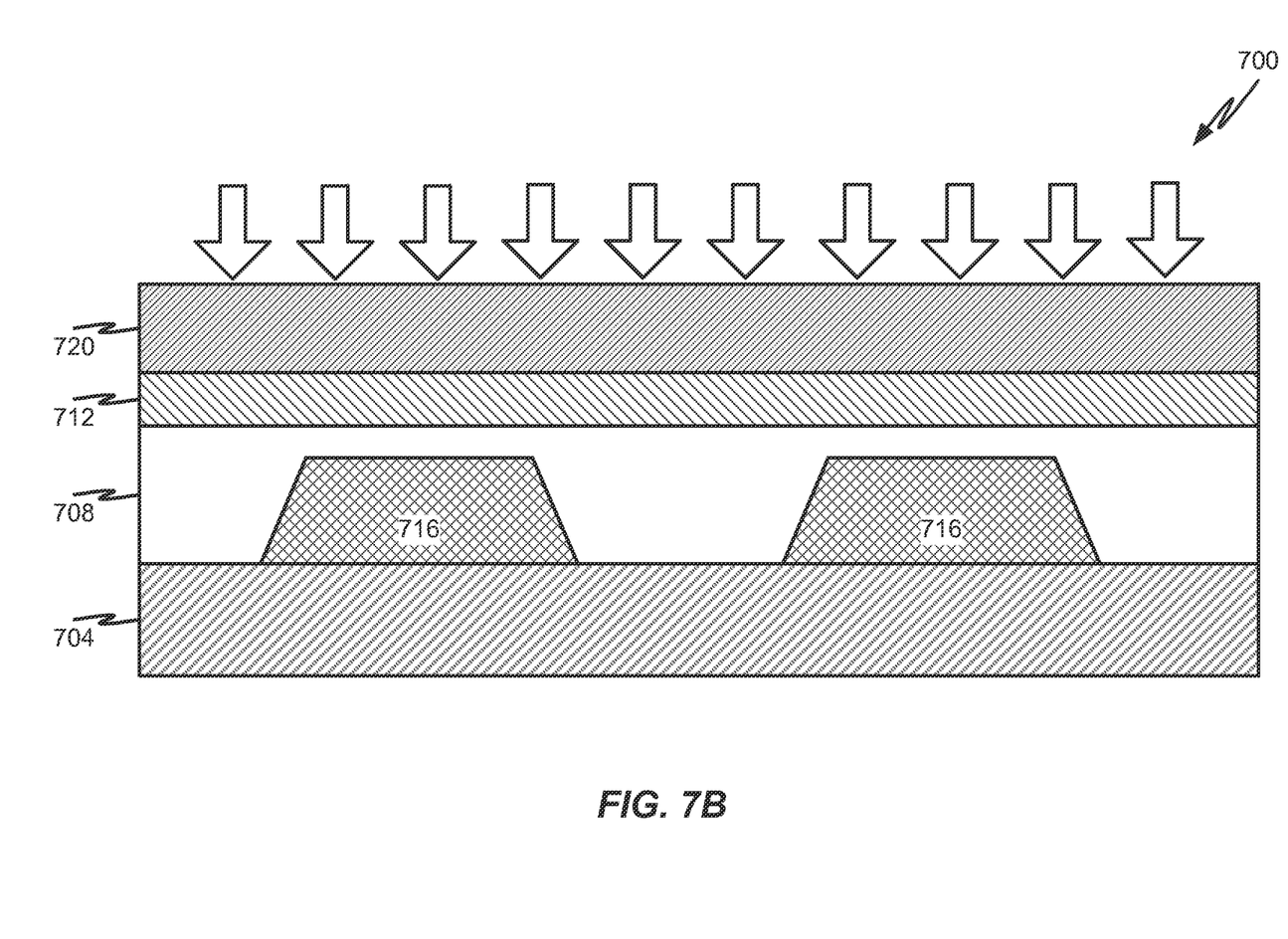
FIG. 7B depicts a cross-sectional view of the capacitive isolator using gap-filling passivation in a second phase of production in accordance with embodiments of the present disclosure.

Accordingly, an improved capacitive isolator 700 may be used as is shown in FIGS. 7A and 7B. The capacitive isolator 700 may correspond to yet another example of a device that can operate as isolator 116. The features of capacitive isolator 700 may alternatively or additionally be incorporated into any of the other capacitive isolators (e.g., capacitive isolator 300, 500 and/or 600) depicted and described herein.

With reference initially to FIG. 7A, the capacitive isolator 700 is shown during a first phase of production. The depicted capacitive isolator 700 is similar to capacitive isolator 600 except that the capacitive isolator 700 avoids conformal passivation. The depicted isolator 700 includes a substrate 700 with a plurality of metal deposits 716 provided thereon. The substrate 704 may be similar or identical to other substrates depicted and described herein. Likewise, the metal deposits 716 may be similar or identical to deposits 616, other capacitive plates, and/or metal deposits 532, 536 depicted and described herein. As compared to isolator 600, the capacitive isolator 700 provides a gap-filling passivation with the bottom passivation layer 708. In other words, the bottom passivation layer 708 comprises a substantially level top surface that does not conform to the contours of the metal deposits 716. A dielectric layer 712 is provided on the bottom passivation layer 708. Similar to other passivation layers described herein, the passivation layer 708 may comprise any type of passivation material. Examples of materials that may be used for the passivation layer 708 include, without limitation, silicon dioxide, silicon nitride, polyimide, and benzocyclobutene. The dielectric layer 612 may comprise any type of dielectric material described herein. In a specific, but non-limiting embodiment, the bottom passivation layer 708 comprises silicon nitride whereas the dielectric layer 712 comprises silicon dioxide.

FIG. 7B shows a second phase of production whereby a stress-reducing layer 720 is provided over the dielectric layer 712. In some embodiments, the stress-reducing layer 720 corresponds to a softer polyimide material that can help to reduce and evenly distribute forces F provided on the top surface of the capacitive isolator 700. In some embodiments, the stress-reducing layer 720 substantially covers the dielectric layer 712 and generally limits the creation of encapsulation stresses at the corners of the metal deposits 716 (e.g., because no lateral forces are created on the passivation layer).

As can be appreciated, any of the capacitive isolators depicted and described herein may be implemented as on-chip solutions (e.g., as a single silicon wafer). In some embodiments, the capacitive isolators may be implemented in an Integrated Circuit (IC) chip having other circuit elements provided therein. Moreover, the terms capacitive isolator and isolation capacitor may be interchangeable terms as used herein. Indeed, any system, system component, or specific device exhibiting features and/or functions of an electrical isolator as well as a capacitive coupler may be considered either a capacitive isolator or isolation capacitor.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An isolation capacitor, comprising:
    a first capacitive element in electrical communication with a first circuit and having a first area;
    a second capacitive element in electrical communication with a second circuit that operates at a different voltage than the first circuit, wherein the second capacitive element comprises a second area;
    a primary isolation layer positioned between the first capacitive element and the second capacitive element, wherein the primary isolation layer substantially prohibits electrical current from flowing between the first capacitive element and second capacitive element; and
    a secondary isolation layer also positioned between the first capacitive element and the second capacitive element, wherein the secondary isolation layer comprises a third area that is larger than at least one of the first area and second area.

2. The isolation capacitor of claim 1, wherein the third area of the secondary isolation layer is larger than both the first area and the second area.

3. The isolation capacitor of claim 1, wherein the first capacitive element comprises a first face and an opposing second face, wherein the second face of the first capacitive element is positioned closer to the second capacitive element than the first face of the first capacitive element, and wherein the secondary isolation layer is positioned adjacent to the second face of the first capacitive element.

4. The isolation capacitor of claim 3, wherein the secondary isolation layer is in direct contact with the second face of the first capacitive element.

5. The isolation capacitor of claim 1, further comprising a substrate on which the first capacitive element, the second capacitive element, the primary isolation layer, and the secondary isolation layer are positioned.

6. The isolation capacitor of claim 5, wherein the primary isolation layer comprises a bulk dielectric material established on the substrate and wherein at least one of the first capacitive element and the second capacitive element are embedded in the bulk dielectric material of the primary isolation layer.

7. The isolation capacitor of claim 6, wherein the secondary isolation layer comprises a dielectric film.

8. The isolation capacitor of claim 6, wherein the dielectric film of the secondary isolation layer is integrated into the bulk dielectric material of the primary isolation layer.

9. The isolation capacitor of claim 1, wherein a dielectric constant of the secondary isolation layer is larger than a dielectric constant of the primary isolation layer and wherein a thickness of the primary isolation layer is greater than a thickness of the secondary isolation layer.

10. The isolation capacitor of claim 1, wherein the first capacitive element comprises a metal plate having a first face and an opposing second face, wherein the second face of the first capacitive element is nearest the second capacitive element, and wherein a length of the first face of the first capacitive element is greater than a length of the second face of the first capacitive element.

11. The isolation capacitor of claim 10, further comprising:
a metal via positioned adjacent to the first capacitive element that carries current between the first capacitive element and an underlying substrate; and
a passivation layer deposited on the first face of the first capacitive element as well as the metal via.

12. The isolation capacitor of claim 1, further comprising:
a passivation layer deposited over the first capacitive element; and
a stress-reducing material deposited on top of the passivation layer to reduce stresses induced on the first capacitive element and an underlying substrate.

13. The isolation capacitor of claim 12, wherein the stress-reducing material comprises a polyimide material that is softer than the passivation layer.

14. An isolation system, comprising:
a first circuit operating at a first voltage range;
a second circuit operating at a second voltage range that is different from the first voltage range; and
an isolator that electrically isolates the first circuit from the second circuit while also enabling control signals to pass between the first circuit and second circuit in the form of electrical flux, wherein the isolator comprises:
a first capacitive element in electrical communication with the first circuit;
a second capacitive element positioned in an overlapping arrangement with the first capacitive element and in electrical communication with the second circuit;
a primary isolation layer positioned between the first capacitive element and the second capacitive element; and
a secondary isolation layer positioned between the first capacitive element and the second capacitive element, wherein the primary isolation layer and secondary isolation layer substantially prevent current from flowing directly between the first capacitive element and the second capacitive element, but enable the electrical flux to pass between the first capacitive element and the second capacitive element.

15. The isolation system of claim 14, wherein the primary isolation layer comprises a bulk dielectric material, wherein the secondary isolation layer comprises a dielectric film having a dielectric constant larger than the bulk dielectric material, and wherein the dielectric film of the secondary isolation layer comprises an outer perimeter that is larger than an outer perimeter of either the first capacitive element or the second capacitive element.

16. The isolation system of claim 15, further comprising a substrate on which the bulk dielectric material is deposited and wherein the dielectric film of the secondary isolation layer is positioned adjacent to the first capacitive element.

17. The isolation system of claim 14, wherein the first capacitive element comprises a metal plate having a first face and an opposing second face, wherein the second face of the first capacitive element is nearest the second capacitive element, wherein a length of the first face of the first capacitive element is greater than a length of the second face of the first capacitive element, wherein the isolator further comprises:
a metal via positioned adjacent to the first capacitive element that carries current between the first capacitive element and an underlying substrate; and
a passivation layer deposited on the first face of the first capacitive element as well as the metal via.

18. The isolation system of claim 14, wherein the isolator further comprises:
a passivation layer deposited over the first capacitive element; and
a polyimide material deposited on top of the passivation layer to reduce stresses induced on the first capacitive element and an underlying substrate.

19. An Integrated Circuit, comprising:
a substrate;
a first dielectric material deposited on the substrate;
a top metal plate positioned over the substrate and within the first dielectric material, wherein the top metal plate is in electrical communication with a first circuit;
a bottom metal plate positioned over the substrate, beneath the top metal plate such that at least a portion of the bottom metal plate overlaps with at least a portion of the top metal plate thereby forming a capacitor therebetween, and within the first dielectric material, wherein the bottom metal plate is in electrical communication with a second circuit that operates at a different voltage than the first circuit; and
a second dielectric material positioned between the top metal plate and the bottom metal plate, wherein the first dielectric material comprises SiO2, wherein the second dielectric material comprises a dielectric film containing SiN, wherein an area of the dielectric film is larger than the top metal plate and the bottom metal plate, wherein a passivation layer is provided over the top metal plate, and wherein at least a portion of the first dielectric material is also positioned between the bottom metal plate and the substrate.

20. The Integrated Circuit of claim 19, wherein the first dielectric material comprises a bulk dielectric material.

* * * * *